United States Patent
Uchikawa et al.

(10) Patent No.: US 8,086,932 B2
(45) Date of Patent: Dec. 27, 2011

(54) APPARATUS AND METHOD FOR DECODING LOW-DENSITY PARITY CHECK CODE

(75) Inventors: Hironori Uchikawa, Yokohama (JP); Kohsuke Harada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 768 days.

(21) Appl. No.: 12/233,673

(22) Filed: Sep. 19, 2008

(65) Prior Publication Data

US 2009/0100312 A1  Apr. 16, 2009

(30) Foreign Application Priority Data

Oct. 16, 2007 (JP) ................................ 2007-269411

(51) Int. Cl.
*H03M 13/00* (2006.01)
(52) U.S. Cl. ........................................ 714/755; 714/786
(58) Field of Classification Search .................. 714/755, 714/786
See application file for complete search history.

(56) References Cited

U.S. PATENT DOCUMENTS

| | | | | |
|---|---|---|---|---|
| 5,469,448 | A * | 11/1995 | Denissen et al. | 714/755 |
| 7,027,533 | B2 * | 4/2006 | Abe et al. | 375/341 |
| 2008/0292025 | A1 * | 11/2008 | Efimov et al. | 375/340 |

OTHER PUBLICATIONS

Fossorier, et al., "Reduced Complexity Iterative Decoding of Low-Density Parity Check Codes Based on Belief Propagation", IEEE Transaction on Communications, vol. 47, No. 5, pp. 673-680, (May 1999).
Levin, et al., "Lazy Scheduling for LDPC Decoding", IEEE Communications Letters, vol. 11, No. 1, pp. 70-72, (Jan. 2007).
Cavus, et al., "A Computationally Efficient Selective Node Updating Scheme for Decoding of LDPC Codes", Proceedings of Military Communication Conference (MILCOM), pp. 1-5, (2005).

* cited by examiner

*Primary Examiner* — Guy Lamarre
(74) *Attorney, Agent, or Firm* — Finnegan, Henderson, Farabow, Garrett & Dunner, L.L.P.

(57) ABSTRACT

There is provided with a decoding apparatus for decoding a low-density parity check code defined by a parity check matrix, includes: a first operation unit configured to carry out a row operation for each row of the parity check matrix; a calculation unit configured to calculate a reliability coefficient with respect to establishment of a parity check equation defined by said each row, respectively; a second operation unit configured to carry out a column operation for said each row; and a controller configured to iteratively execute one set which includes respective processing by the first operation unit, the calculation unit and the second operation unit and omit the processing by the first operation unit and the calculation unit for a row for which the reliability coefficient has satisfied a threshold.

16 Claims, 8 Drawing Sheets

APPARATUS AND METHOD FOR DECODING LOW-DENSITY PARITY CHECK CODE

CROSS REFERENCE TO RELATED APPLICATIONS

This application is based upon and claims the benefit of priority from the prior Japanese Patent Applications No. 2007-269411, filed on Oct. 16, 2007; the entire contents of which are incorporated herein by reference.

BACKGROUND OF THE INVENTION

1. Field of the Invention

The present invention relates to a decoding apparatus and a decoding method for decoding LDPC (Low Density Parity Check) codes used in a communication system, recording system or the like, and more particularly, to a decoding algorithm.

2. Related Art

LDPC codes are decoded by iteratively carrying out probability calculations called "row operation" and "column operation" using a parity check matrix and calculating a posterior probability of received word data.

The row operation refers to processing of obtaining row operation data for each element of "1" using column operation data corresponding to elements of "1" for each row of a parity check matrix (parity check equation). On the other hand, the column operation refers to processing of obtaining column operation data for each element of "1" using row operation data corresponding to elements of "1" for each column of the parity check matrix. Generally, row operation is carried out on all rows of the parity check matrix and then column operation is carried out on all columns.

In LDPC code decoding processing, a row operation carrying out operation in a row direction of the parity check matrix carries out calculations on a nonlinear function, and therefore the amount of operation is particularly large. For this reason, as proposed in a document, Marc P. C. Fossorier, M. Mihalijevic and H. Imai "Reduced Complexity Iterative Decoding of Low-Density Parity Check Codes Based on Belief Propagation" IEEE Trans. on Commun. Vol. 47, No. 5, pp. 673-680, May 1999, min-sum decoding is used which obtains a minimum value of the column operation data corresponding to other elements of "1" except the element in question for each element of "1" in each row of the parity check matrix.

However, even if min-sum decoding is used, comparison operation for calculating a minimum value of column operation data must be carried out iteratively by the number of "1"s included in a row (parity check equation) to calculate a minimum value of the column operation data and the amount of row operation in the whole decoding processing is still large. Since an LDPC code having a high coding rate in particular has many "1"s included in a row (parity check equation), the amount of operation particularly increases, resulting in a problem that the decoding throughput deteriorates.

SUMMARY OF THE INVENTION

According to an aspect of the present invention, there is provided with a decoding apparatus for decoding a low-density parity check code defined by a parity check matrix, comprising:

a reception unit configured to receive word data;

a first storage configured to store the received word data for each element of the parity check matrix as initialized column operation data, each element being defined by a row number and a column number, respectively;

a second storage configured to receive row operation data and a write request of the row operation data and store the row operation data for an element according to the write request;

a first operation unit configured to read column operation data in the first storage for elements of "1" for each row of the parity check matrix, carry out a row operation to thereby calculate row operation data for each of the elements of "1" for said each row and request writing of calculated row operation data to the second storage by specifying each of the elements of "1";

a calculation unit configured to read column operation data in the first storage for elements of "1" for each row of the parity check matrix and calculate a reliability coefficient with respect to establishment of a parity check equation defined by said each row, respectively;

a second operation unit configured to read row operation data in the second storage for elements of "1" for each column of the parity check matrix, carry out a column operation to thereby calculate column operation data for each of the elements of "1" for said each column and write calculated column operation data into the first storage for each of the elements of "1"; and a controller configured to iteratively execute one set which includes respective processing by the first operation unit, the calculation unit and the second operation unit and omit the processing by the first operation unit and the calculation unit in the one set for a row for which the reliability coefficient has satisfied a threshold.

According to an aspect of the present invention, there is provided with a decoding apparatus for decoding a low-density parity check code defined by a parity check matrix, comprising:

a reception unit configured to receive word data;

a data storage configured to store the received word data for each element of the parity check matrix, each element being defined by a row number and a column number, respectively;

a second storage configured to store initialized row operation data for each element of the parity check matrix, each element being defined by a row number and a column number;

a first storage configured to receive column operation data and a write request of the column operation data and store the column operation data for an element according to the write request;

a second operation unit configured to read the received word data from the data storage for elements of "1" for each row of the parity check matrix, read row operation data from the second storage for elements of "1" for each row of the parity check matrix, carry out a column operation to thereby calculate column operation data for each the elements of "1" for said each row and request writing of calculated column operation data to the first storage by specifying each of the elements of "1";

a first operation unit configured to read column operation data from the first storage for elements of "1" for said each row, carry out a row operation to thereby calculate row operation data for each of the elements of "1" for said each row and write calculated row operation data into the second storage for each of the elements of "1";

a calculation unit configured to calculate a reliability coefficient with respect to establishment of a parity check equation defined by said each row, respectively using the column operation data read from the first storage for said each row;

a data updating unit configured to update the received word data in the data storage based on the column operation data calculated by the second operation unit and the row operation data calculated by the first operation unit for said each row; and a controller configured to iteratively execute one set which includes respective processing by the second operation unit, the first operation unit, the calculation unit and the data updating unit and omit execution of the one set for a row for which the reliability coefficient has satisfied a threshold.

According to an aspect of the present invention, there is provided with a decoding method for decoding a low-density parity check code defined by a parity check matrix, comprising:

receiving word data;

storing initialized column operation data which is the received word data in a first storage for each element of the parity check matrix, each element being defined by a row number and a column number, respectively;

reading column operation data in the first storage for elements of "1" for each row of the parity check matrix, carrying out a row operation to thereby calculate row operation data for each of the elements of "1" for said each row and writing calculated row operation data to a second storage for each of the elements of "1";

reading column operation data in the first storage for elements of "1" for said each row and calculating a reliability coefficient with respect to establishment of a parity check equation defined by said each row, respectively;

reading row operation data in the second storage for elements of "1" for said each column, carrying out a column operation to thereby calculate column operation data for each of the elements of "1" for said each row and writing calculated column operation data into the first storage for each of the elements of "1";

iteratively executing one set which includes the calculation and the writing of the row operation data, the calculation of the reliability coefficient, the calculation and the writing of the column operation data; and omitting said calculation and writing of the row operation data and said calculation of the reliability coefficient in the one set for a row for which the reliability coefficient has satisfied a threshold.

According to an aspect of the present invention, there is provided with a decoding method for decoding a low-density parity check code defined by a parity check matrix, comprising:

receiving word data and writing the received word data into a data storage for each element of the parity check matrix, each element being defined by a row number and a column number, respectively;

reading the received word data from the data storage for elements of "1" for each row of the parity check matrix, reading row operation data for elements of "1" for each row of the parity check matrix from a second storage which stores initialized row operation data in advice for each element of the parity check matrix, each element being defined by a row number and a column number, carrying out a column operation to thereby calculate column operation data for each of the elements of "1" for said each row and writing calculated column operation data to the first storage for each of the elements of "1";

reading column operation data from the first storage for elements of "1" for said each row, carrying out a row operation to thereby calculate row operation data for each of the elements of "1" for said each row and writing calculated row operation data into the second storage for each of the elements of "1";

calculating a reliability coefficient with respect to establishment of a parity check equation defined by said each row, respectively, using the column operation data read from the first storage for said each row;

updating the received word data in the data storage based on the calculated column operation data and the calculated row operation data for said each row;

iteratively executing one set which includes the calculation and the writing of the column operation data, the calculation and the writing of the row operation data, the calculating of the reliability coefficient and the updating of the received word data; and omitting execution of the one set for a row for which the reliability coefficient has satisfied a threshold.

DETAILED DESCRIPTION OF THE INVENTION

With reference now to the attached drawings, embodiments of the present invention will be explained in detail below.

Figure 1:
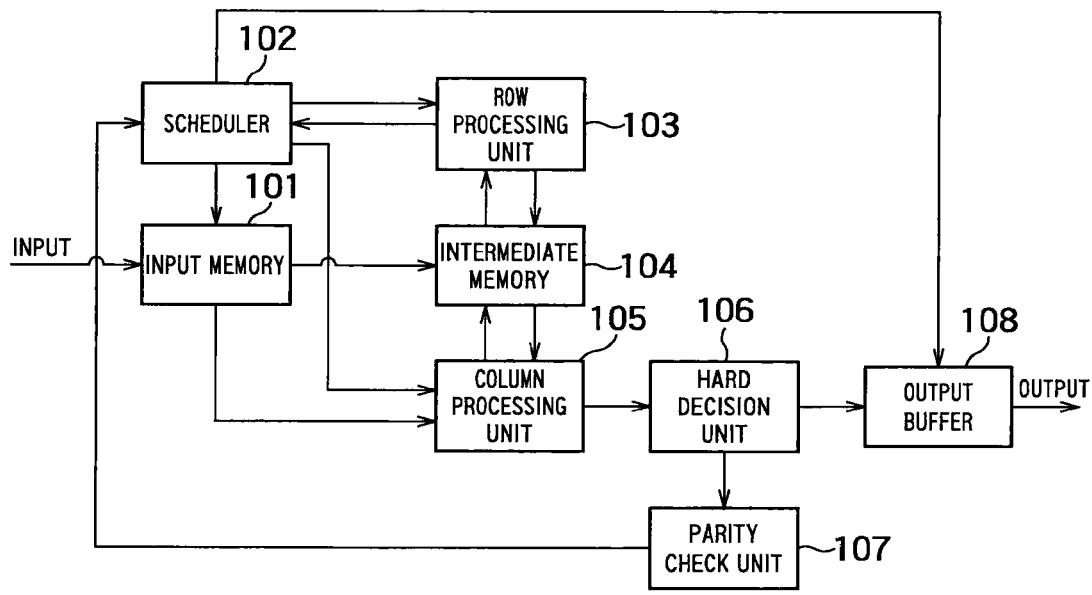
FIG. 1 is a block diagram showing the configuration of a decoding apparatus according to a first embodiment.

FIG. 1 is a block diagram showing the configuration of a decoding apparatus according to a first embodiment of the present invention. This decoding apparatus may also be simultaneously provided with the configuration of a coding apparatus that carries out coding.

The above described decoding apparatus is provided with an input memory 101, a scheduler (controller, termination unit) 102, a row processing unit (first operation unit, a calculation unit) 103, an intermediate memory (second storage, first storage) 104, a column processing unit (second operation unit, data correction unit) 105, a hard decision unit 106, a parity check unit 107 and an output buffer (output unit) 108.

The input memory 101 receives received word data (coded data frame) inputted from a preceding signal processing unit (not shown) and stores the received word data during decoding processing. The input memory 101 includes, for example, a reception unit which receives received word data. The received word data is made up of the same number of elements as bits of a codeword generated by the coding apparatus and each element represents a log likelihood rate (LLR) of the corresponding bit. Each log likelihood rate of the received word data stored in the input memory 101 is called an "input LLR."

Here, the log likelihood rate (LLR) is a logarithmic value (the base is a natural logarithm) of a ratio of the probability P (x=0) that the data bit may be 0 to the probability P (x=1) that the data bit may be 1, and is expressed by the following expression.

$$\log\left(\frac{P(x=0)}{P(x=1)}\right) \quad \text{[Formula 1]}$$

Figure 10:
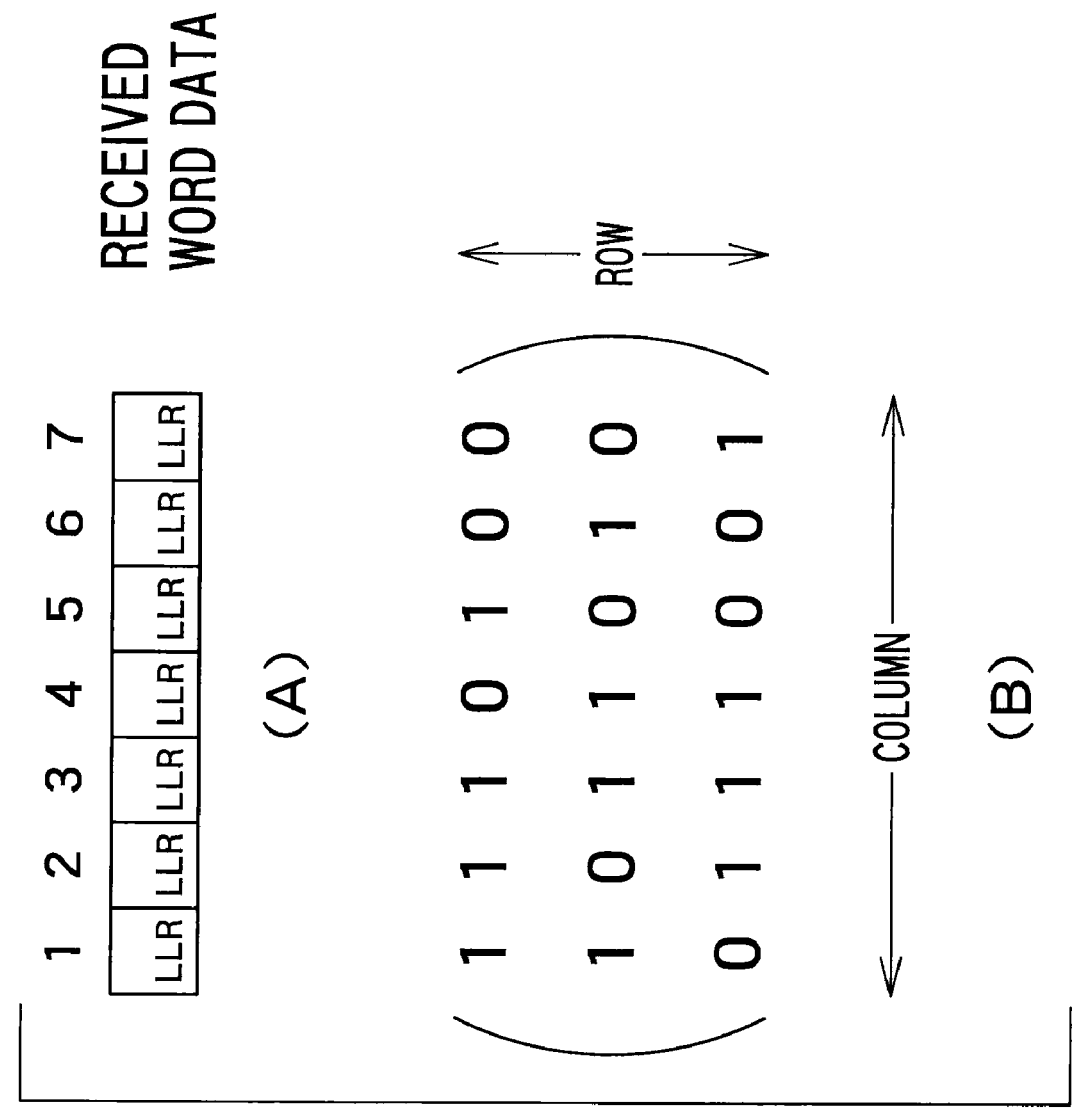
FIG. 10 illustrates an example of received word data and an example of parity check matrix.

FIG. 10 shows an example of the received word data. Here, received word data corresponding to a codeword made up of 7 bits is shown and the received word data is made up of 7 LLRs (input LLRs).

The scheduler (controller) 102 performs control over the entire decoding processing. The scheduler 102 instructs the row processing unit 103 and the column processing unit 105 to execute row processing (row operation, syndrome value (reliability coefficient) operation), column processing (column operation and output LLR (corrected LLR) operation). This embodiment assumes row processing and column processing as one set and performs decoding by iterating this set one or more times.

Furthermore, the scheduler 102 instructs the input memory 101 to send the received word data (input LLR) in the input memory 101 to the intermediate memory 104 at the start of decoding.

Furthermore, the scheduler 102 instructs the input memory 101 to output the received word data (input LLR) in the input memory 101 to the column processing unit 105 at the timing of column processing by the column processing unit 105.

Furthermore, the scheduler 102 judges whether or not to end the decoding processing based on the parity check result (true OR false) inputted from the parity check unit 107 and the iteration count of decoding realized until the present time, and instructs, when ending of the decoding processing is determined, the output buffer 108 to output the decoding result (decoded word) to a signal processing unit (not shown) in the subsequent stage.

Furthermore, the scheduler 102 is characterized by controlling the row processing unit 103 so as to execute only necessary minimum row processing and thereby reducing the amount of operation necessary for the whole decoding processing and improving the decoding throughput. Details of this feature will be explained after explanations of the row processing unit 103 and the column processing unit 105.

The intermediate memory 104 is used to exchange data between the row processing unit 103 and the column processing unit 105. At the start of decoding, the intermediate memory 104 stores received word data (input LLR) inputted from the input memory 101 according to an instruction from the scheduler 102 as the initialized column operation data (column element LLR) for each element in the parity check matrix, each element being defined by a row number and a column number, respectively.

Figure 11:
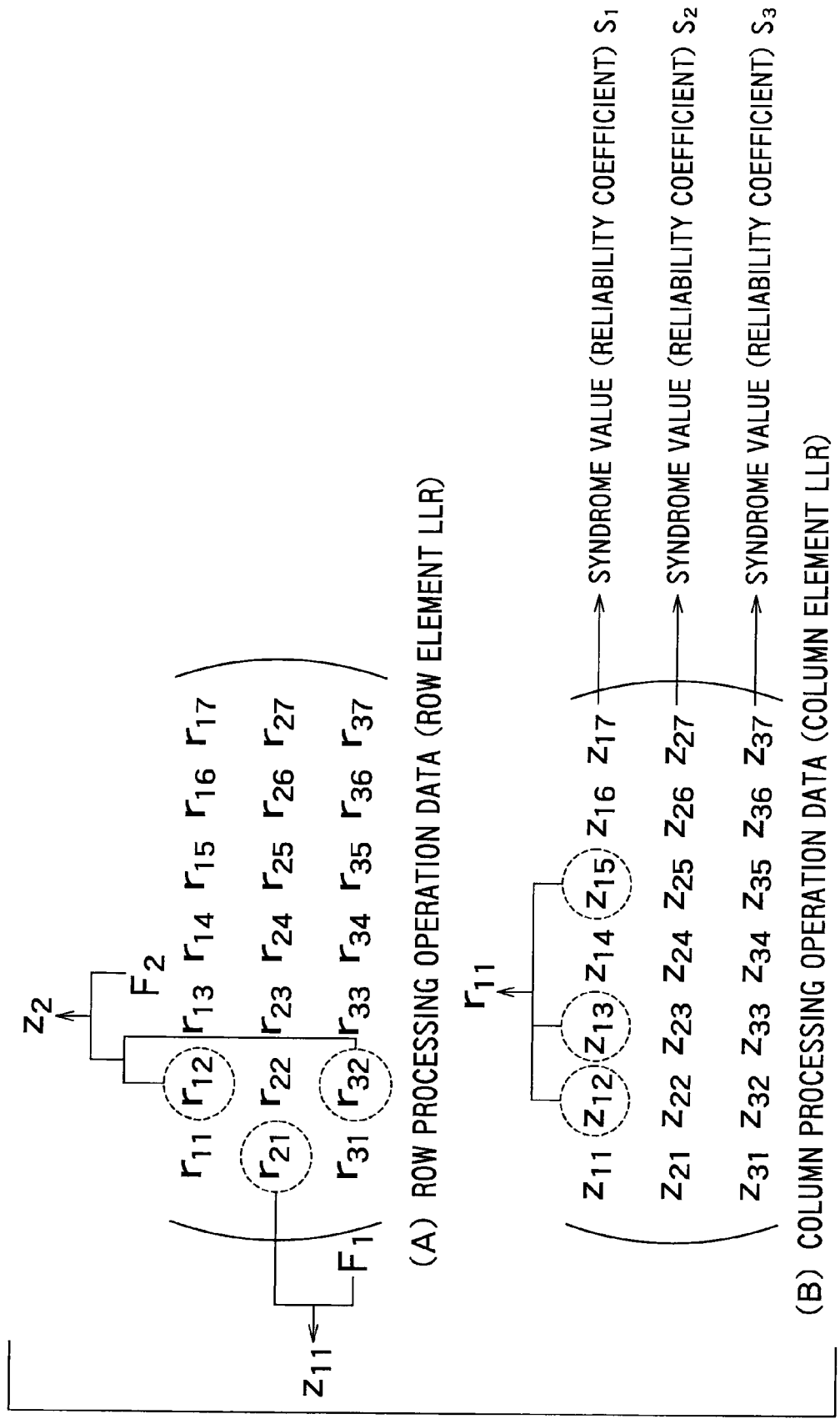
FIG. 11 illustrates row processing and column processing.

FIG. 10(B) shows an example of parity check matrix. This parity check matrix corresponds to a 7-bit codeword and can be used to decode the received word data in FIG. 10(A). FIG. 11(B) shows an example of column operation data (details will be described later). The number of columns in the parity check matrix is the same as the number of elements of the received word data, for example, and the same input LLR (input LLR corresponding to the column number in the received word data) is stored for each row element of the same column number in the intermediate memory 104 as the initialized column operation data. However, the initialized column operation data is only stored for elements of "1" in the parity check matrix and not used for operation for elements of "0", and therefore need not be stored. For example, in the case of the parity check matrix in FIG. 10(B), $Z_{14}$, $Z_{16}$ and $Z_{17}$ need not be stored.

The row processing unit (first operation unit, calculation unit) 103 executes row processing (row operation and syndrome value (reliability coefficient) operation) according to the parity check equation of a row index specified from the scheduler 102. Here, the row index means a row index of a parity check matrix of LDPC (Low Density Parity Check) code.

More specifically, the row processing unit 103 reads the column operation data (initialized column operation data first) stored in the intermediate memory 104 for elements of "1" of the row specified in the check matrix, carries out a row operation and thereby calculates row element LLR (row operation data) for the elements of "1".

Furthermore, the row processing unit 103 calculates a syndrome value (reliability coefficient) indicating the degree of reliability with respect to the establishment of a parity check equation on the above specified row using the column operation data read through the above described row processing.

The row processing unit 103 outputs a syndrome value (reliability coefficient) to the scheduler 102 and writes a row element LLR (row operation data) to the intermediate memory 104 for the corresponding element (row number and column number).

As will be described later, at the first decoding, all row indexes are sequentially specified from the scheduler 102 for the row processing unit 103, but at the second or subsequent decoding, a minimum number of row indexes are specified so as to reduce the amount of operation necessary for the entire decoding processing.

Here, the syndrome value (reliability coefficient) is calculated from following Formula 2 and the row element LLR (row operation data) is calculated from Formula 3.

$$s_m^{(i)} = \prod_{n \in N(m)} \text{sign}(z_{mn}^{(i-1)}) \times \min_{n \in N(m)} (|z_{mn}^{(i-1)}|) \quad \text{[Formula 2]}$$

$$r_{mn}^{(i)} = \prod_{n' \in N(m)\backslash n} \text{sign}(z_{mn'}^{(i-1)}) \times \min_{n' \in N(m)\backslash n} (|z_{mn'}^{(i-1)}|) \quad \text{[Formula 3]}$$

In above described Formula 2 and Formula 3, "m" represents a row index and "n" represents a column index of the parity check equation. In the case of FIG. 10(B), m is 1 to 3 and n is 1 to 7.

N(m) represents a set of column indexes having values of "1" in the parity check equation of the row index m and N(m)\n represents a partial set of the column index with n removed from the set N(m).

sign ($z_{mn}^{(i-1)}$) represents the sign of $z_{mn}^{(i-1)}$ sign ($z_{mn}^{(i-1)}$)) represents the sign of column element LLR (column operation data) $z_{mn'}^{(i-1)}$.

$$\min_{n \in N(m)} (|z_{mn}^{(i-1)}|)$$

represents a column element LLR (column operation data) with the smallest absolute value out of the column element LLR (column operation data) $z_{mn'}^{(i-1)}$ corresponding to the column index included in the column index set N(m). Likewise $$\min_{n' \in N(m) \setminus n} (|z_{mn'}^{(i-1)}|)$$

represents a column element LLR (column operation data) with the smallest absolute value out of the column element LLR (column operation data) $z_{mn'}^{(i-1)}$ corresponding to the column index included in the column index set N(m)\n.

"i" represents the number of iterations of decoding processing and the row element LLR (row operation data) $r_{mn}^{(i)}$ obtained through the row operation in the ith decoding processing is calculated using the column element LLR (column operation data) $z_{mn}^{(i-1)}$ obtained in the (i−1)th decoding processing. In the first decoding processing, $z_{mn}^{0} = F_n$ (see the explanation of the intermediate memory 104). "Fn" a represents an input LLR (received word data) inputted from a preceding signal processing unit (not shown) to the decoding apparatus.

FIG. 11(B) shows how the syndrome value (reliability coefficient) is more specifically calculated according to Formula 2 above and how the row element LLR (row operation data) is more specifically calculated according to Formula 3. Here, an example of obtaining $r_{11}$ as the row element LLR (row operation data) is shown and an example of obtaining s1 as the syndrome value (reliability coefficient) is shown. However, suppose the parity check matrix is as shown in FIG. 10(B). To obtain $r_{11}$, column operation data $z_{12}$, $z_{13}$, $z_{15}$ corresponding to elements of "1" on the first row may be read from the intermediate memory 104 ($z_{11}$ is not used) and calculated according to Formula 2 above. Furthermore, to obtain $s_1$, column operation data $z_{11}$, $z_{12}$, $z_{13}$, $z_{15}$ corresponding to elements of "1" on the first row may be read from the intermediate memory 104 and $s_1$ is calculated according to Formula 3 above.

Here, as is clear from a comparison between Formula 2 and Formula 3, column element LLR (column operation data) $s_m^{(i)}$ column indexes included in the parity check equation of the row index m is used to calculate the syndrome value (reliability coefficient) $z_{mn'}^{(i-1)}$, whereas the row element LLR (row operation data) $r_{mn}^{(i)}$ is calculated using the column element LLR (column operation data) $z_{mn'}^{(i-1)}$ by excluding the noticed column index n. For this reason, there is also a calculation method using Formula 4 instead of using Formula 3 when calculating the row element LLR (row operation data) $r_{mn}^{(i)}$. When calculating the syndrome value (reliability coefficient), this method stores not only the column element LLR (column operation data) having a minimum absolute value but also a column index $n_{s_m^{(i)}}$ of the column element LLR having a minimum absolute value and the column element LLR (column operation data) having the second minimum absolute value as $t_m^{(i)}$.

$$r_{mn}^{(i)} = \begin{cases} \operatorname{sign}(z_{mn}^{(i-1)}) \times \operatorname{sign}(s_m^{(i)}) \times |s_m^{(i)}| (n \neq n_{s_m^{(i)}}) \\ \operatorname{sign}(z_{mn}^{(i-1)}) \times \operatorname{sign}(s_m^{(i)}) \times |t_m^{(i)}| (n = n_{s_m^{(i)}}) \end{cases} \quad [\text{Formula 4}]$$

Furthermore, the row operation may also use min Formula 5 which multiplies $\min|z_{mn'}^{(i-1)}|$ by a coefficient α or Formula 6 which subtracts a coefficient β instead of Formula 3.

$$r_{mn}^{(i)} = \alpha \times \prod_{n' \in N(m) \setminus n} \operatorname{sign}(z_{mn'}^{(i-1)}) \times \min_{n' \in N(m) \setminus n} (|z_{mn'}^{(i-1)}|) \quad [\text{Formula 5}]$$

$$r_{mn}^{(i)} = \prod_{n' \in N(m) \setminus n} \operatorname{sign}(z_{mn'}^{(i-1)}) \times \max(\min_{n' \in N(m) \setminus n} (|z_{mn'}^{(i-1)}|) - \beta, 0) \quad [\text{Formula 6}]$$

max (x, y) in Formula 6 above is a function which outputs x or y, whichever is the larger. The algorithm shown in these Formula 5 and Formula 6 is called a "modified-min-sum algorithm" and generally has better decoding performance than the min-sum algorithm shown in Formula 3.

The column processing unit 105 executes column processing (column operation, output LLR (corrected LLR) operation) on the column of the column index specified from the scheduler 102. The column processing unit 105 performs column processing on each column index sequentially specified from the scheduler 102.

More specifically, the column processing unit 105 reads the row element LLR (row operation data) stored in the intermediate memory 104 from elements of "1" of the specified column in the check matrix, performs a column operation based on the read row element LLR (row operation data) and input LLR inputted from the input memory 101 (LLR corresponding to the column specified by the scheduler 102 in the received word data) and thereby calculates the column element LLR (column operation data) on the elements of "1". The column processing unit 105 writes the calculated column element LLR (column operation data) into the intermediate memory 104 for the corresponding element (row number and column number)(suppose the previous value is updated). A calculation expression for calculating the column element LLR (column operation data) $z_{mn}^{(i)}$ is shown below.

$$z_{mn}^{(i)} = F_n + \sum_{m' \in M(n) / m} r_{m'n}^{(i)} \quad [\text{Formula 7}]$$

Here, "$F_n$" represents the input LLR (received word data) of the column index n and $r_{mn}^{(i)}$ represents the row element LLR (row operation data) calculated by the row processing unit 103. Furthermore, M(n)\m represents a partial set of the row index resulting from removing m from the set M(n).

FIG. 11(A) shows how the column element LLR (column operation data) is calculated according to Formula 7 above. Here, an example of calculating $z_{11}$ is shown. However, suppose the parity check matrix is as shown in FIG. 10(B). To calculate $z_{11}$, the column operation data $r_{21}$ corresponding to elements of "1" on the first column may be read from the intermediate memory 104 ($z_{31}$ is not used), and furthermore, the input LLR (received word data) $F_1$ corresponding to the first column may be read from the input memory 101 and calculated according to Formula 7 above.

Furthermore, the column processing unit 105 reads the row element LLR (row operation data) stored in the intermediate memory 104 for elements of "1" on the column specified from the scheduler 102, corrects the input LLR (LLR corresponding to the column specified by the scheduler 102 in the received word data) inputted from the input memory 101 based on the read row operation data and thereby calculates the output LLR (corrected LLR). The column processing unit 105 outputs the calculated output LLR (corrected LLR) to the hard decision unit 106. That is, the received word data (input LLR) inputted to the input memory 101 is corrected to the corrected word data (output LLR or corrected LLR) through row processing and column processing and outputted.

Here, the calculation expression for calculating output LLR (corrected LLR) $z_n^{(i)}$ is shown below. As shown below, output LLR $z_n^{(i)}$ is calculated from input LLR $F_n$ and row element LLR (row operation data $r_{mn}^{(i)}$).

$$z_n^{(i)} = F_n + \sum_{m \in M(n)} r_{mn}^{(i)} \quad \text{[Formula 8]}$$

While the column element LLR (column operation data) $z_{mn}^{(i)}$ in Formula 7 does not include the row element LLR (row operation data) $r_{mn}^{(i)}$ of the noticed row index in the sum total of the second term, in the calculation of the output LLR (corrected LLR) $z_n^{(i)}$, the noticed row index is included and the row element LLR (row operation data) $r_{mn}^{(i)}$ of the row index where "1"s exist in the column of the column index n is included in the sum total of the second term. That is, the output LLR (corrected LLR) $z_n^{(i)}$ becomes a value resulting from adding the sum total of the row element LLR (row operation data) $r_{mn}^{(i)}$ calculated using the parity check equation of the row where "1"s exist in the column of the column index n to the input LLR $F_n$.

FIG. 11(A) shows how the output LLR (corrected LLR) is calculated according to Formula 8 above. Here, an example of calculating $z_2$ is shown. However, suppose the parity check matrix is as shown in FIG. 10(B). To calculate $z_2$, the row element LLR (row operation data) $r_{12}$ and $r_{32}$ corresponding to elements of "1" on the second column may be read from the intermediate memory 104 and the input LLR (received word data) $F_2$ corresponding to the second column may be read from the input memory 101 and calculated according to Formula 8 above.

As described above, the intermediate memory 104 is used to exchange data between the row processing unit 103 and column processing unit 105 and stores the row element LLR (row operation data) $r_{mn}^{(i)}$ written from the row processing unit 103 and the column element LLR (column operation data) $z_{mn}^{(i)}$ written from the column processing unit 105. The intermediate memory 104 receives write requests from the row processing unit 103 and column processing unit 105 and stores the row element LLR (row operation data) $r_{mn}^{(i)}$ and column element LLR (column operation data) $z_{mn}^{(i)}$. The intermediate memory 104 outputs the row element LLR (row operation data) $r_{mn}^{(i)}$ to the column processing unit 105 and the column element LLR (column operation data) $z_{mn}^{(i)}$ to the row processing unit 103 respectively.

Figure 2:
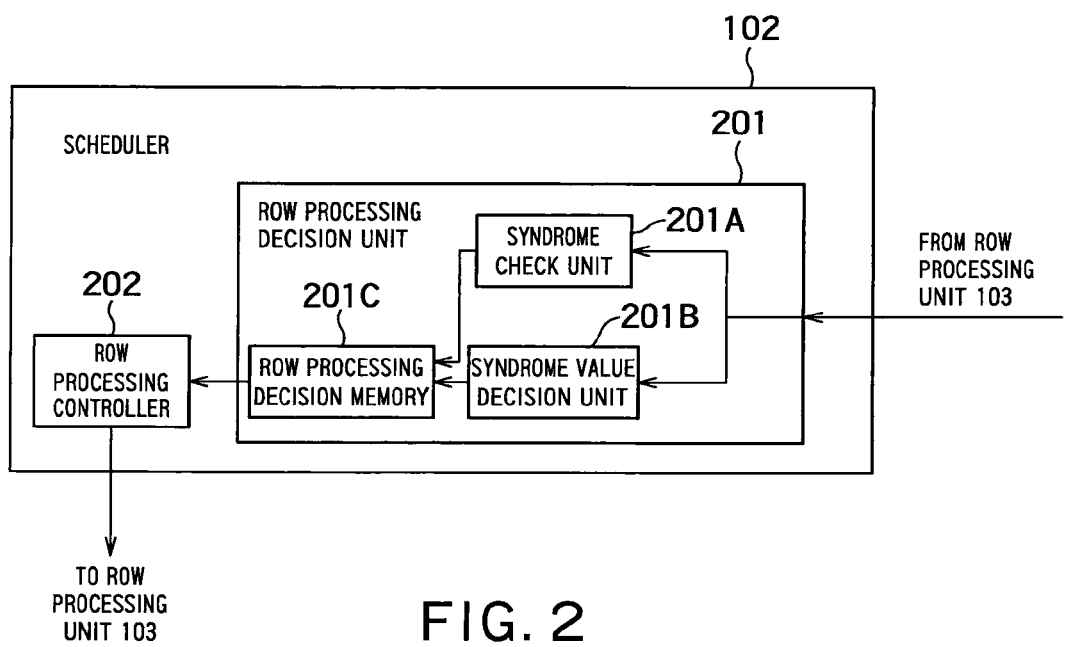
FIG. 2 is a block diagram of a scheduler in the decoding apparatus in FIG. 1.

FIG. 2 is a detailed block diagram of the scheduler 102. However, FIG. 2 only shows blocks related to a reduction of the amount of calculation of row processing and omits blocks which perform other basic processing, for example, display of a counter for counting the number of iterations of decoding.

The scheduler 102 is provided with a row processing decision unit 201 and a row processing controller 202.

The row processing decision unit 201 has a syndrome check unit 201A, a syndrome value decision unit 201B and a row processing decision memory 201C (flag storage, flag initialization unit).

The row decision processing unit 201 separates the syndrome value (reliability coefficient) inputted for each row from the row processing unit 103 into a sign and an absolute value and inputs information on the sign to the syndrome check unit 201A and information on the absolute value to the syndrome value decision unit 201B respectively.

The syndrome check unit 201A checks whether the sign of the syndrome value is positive or negative and outputs "true" when positive and "false" when negative to the row processing decision memory 201C.

The syndrome value decision unit 201B decides whether or not the inputted absolute value is greater than a predefined threshold and outputs "true" when greater than the threshold and "false" when equal to or lower than the threshold to the row processing decision memory 201C. Suppose the threshold here is calculated beforehand from a numerical experiment such as computer simulation. Furthermore, a value which varies from one row index to another may be set as the threshold.

The row processing decision memory 201C has a processing flag for each row index of the check matrix. The initial value of the processing flag is set, for example, to "true" (second value). The row processing decision memory 201C sets, when both inputs from the syndrome check unit 201A and syndrome value decision unit 201B are "true," the processing flag of the row index corresponding to the syndrome value inputted to the scheduler 102 to "false" (first value). As described above, the row index means a row index of the parity check matrix of the LDPC (Low Density Parity Check) code.

The row processing controller 202 selects the row index to be processed next based on the row processing decision memory 201C, specifies the selected row index and thereby instructs the row processing unit 103 to execute the row processing. In this case, the number of the row index is selected so as to skip the row processing of a row index whose processing flag is "false." The selection method is ascending order of row index numbers, for example. Every time processing on one row is completed (every time a syndrome value (reliability coefficient) is inputted from the row processing unit 103), the row index to be processed next is selected and the selected row index is instructed to the row processing unit 103. In this way, by controlling the row processing unit 103 so as to execute only the necessary minimum row processing, it is possible to reduce the amount of calculation necessary for the whole decoding processing and improve the decoding throughput.

The hard decision unit 106 decides whether the output LLR (corrected LLR) inputted from the column processing unit 105 is positive or negative. When positive, the output LLR is decided to be "0" and when negative, the output LLR is decided to be "1." The hard decision result (hard decision data) of "0" or "1" decided for each bit is outputted to the parity check unit 107 and output buffer 108.

The parity check unit 107 checks whether or not the hard decision data inputted from the hard decision unit 106 satisfies a parity check equation (check equation of each row in the check matrix) of the LDPC code and outputs the check result indicating whether or not all parity check equations are satisfied to the scheduler 102.

The output buffer 108 stores the hard decision data inputted from the hard decision unit 106. The output buffer 108 outputs the hard decision data instructed from the scheduler 102 to be outputted to a signal processing unit (not shown) in the subsequent stage. The hard decision data not instructed to be outputted is discarded, for example. When a check result indicating "true" (all check equations are satisfied) is inputted from the hard decision unit 106, the scheduler 102 instructs the output buffer 108 so as to output hard decision data from which this check result is obtained.

Next, the operation of the decoding apparatus having the above described configuration will be explained.

Figure 3:
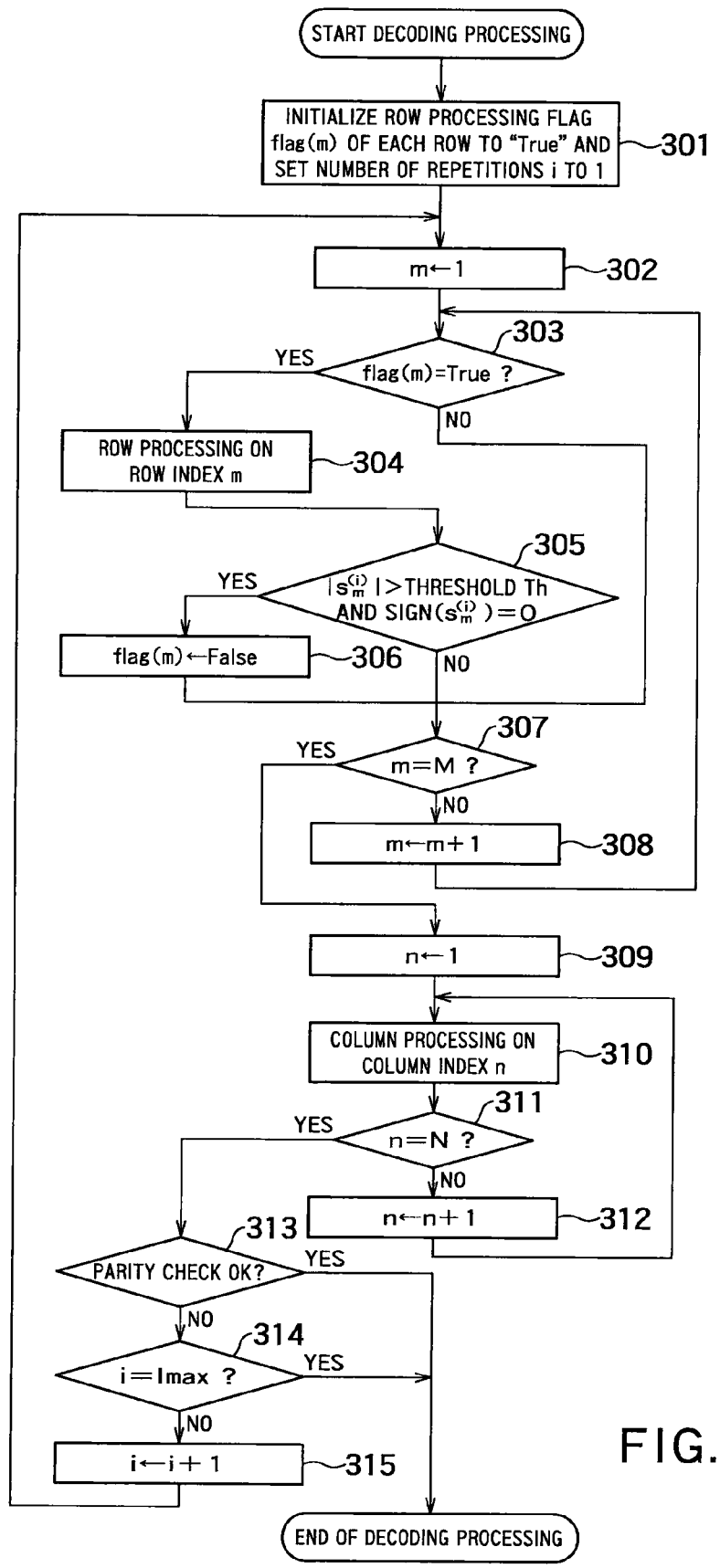
FIG. 3 is a flowchart illustrating a decoding method according to the first embodiment.

FIG. 3 is a flowchart showing a flow of operation of the decoding apparatus in FIG. 1. In FIG. 3, suppose "m" represents a row index and "n" represents a column index, the number of rows of the parity check matrix is "M" and the number of columns is "N." Furthermore, suppose "i" represents the number of iterations and "Imax" represents the maximum number of iterations. The processes 302 to 308 correspond to row processing and processes 309 to 312 correspond to column processing.

The received word data (input LLR) is inputted from a signal processing unit (not shown) in the preceding stage to the decoding apparatus in FIG. 1. When all the received word data is inputted, the decoding apparatus starts the decoding processing. The inputted received word data is stored in the input memory 101 while the decoding processing is being carried out.

First, initial processing is performed in step 301. More specifically, all row processing flags in the row processing decision memory 201C are set to "true" (second value) and further the iteration number "i" is set to "1."

Next, in step 302, the row index m for executing the row processing is set to "1."

Next, in step 303, it is decided whether or not the row processing flag of the row index m is "true" and when the row processing flag is "false" (first value), the row operation and syndrome value (reliability coefficient) operation are skipped and the process moves to step 307. When the row processing flag is "true," row operation is executed on the row index m in step 304. In next step 305, it is decided whether or not the absolute value of the syndrome value (reliability coefficient) is greater than a predetermined threshold and the sign of the syndrome value (reliability coefficient) is "0" (positive) (syndrome value (reliability coefficient) operation).

When the decision in step 305 is "NO," the process moves to step 307. When the decision in step 305 is "YES," the process moves to step 306, and sets the row processing flag of the row index m to "false."

In step 307, it is decided whether or not the row index m is a final row index M and when the decision is "NO," the row index m is incremented in step 308 and the process returns to step 303.

When the decision in step 307 is "YES," the process moves to step 309 and sets the column index n to 1. In step 310, column processing is performed on the column index "n."

Next, it is decided in step 311 whether or not the column index n is final column index N and when the decision is "NO," the column index n is incremented in step 312 and the process returns to processing 310.

When the decision in step 311 is "YES," a hard decision is made and then a parity check is made in step 313. When the parity check result is "true" (all check equations are satisfied), the decoding processing is finished and the hard decision data obtained by a hard decision is outputted as decoding degree data and when the decision is "false," the process moves to step 314.

In step 314, it is decided whether or not the iteration number "i" has reached the maximum number of iterations "Imax," and the decoding processing is finished when the decision is "YES." The hard decision data obtained through a hard decision may be outputted to the subsequent stage or may be discarded. When the decision is "NO," the iteration number "i" is incremented in step 315 and the process then returns to step 302.

On the other hand, though the explanation in FIG. 3 has assumed that a parity check is made once per iteration in step 313, but a parity check may also be made once every plurality of iterations (in that case, output LLR (corrected LLR) operation may also be carried out once every plurality of iterations). Though excess iterations may occur compared to the case where a parity check is made once every iteration, since the present invention controls row processing using row processing flags, no excess amount of operation occurs for row processing with a large amount of operation. For example, in an environment in which five iterations occur on average, the amount of operation required for 1 to 4 parity checks can be reduced by making such a setting that a parity check can be made once every five iterations.

Furthermore, that the row processing flag is "false" ("0") means that the parity check is satisfied, and therefore when logical OR of row processing flags of all row indexes become "false," it is also possible to judge that the processing has been completed, make a hard decision without making any parity check and finish decoding processing.

Figure 4:
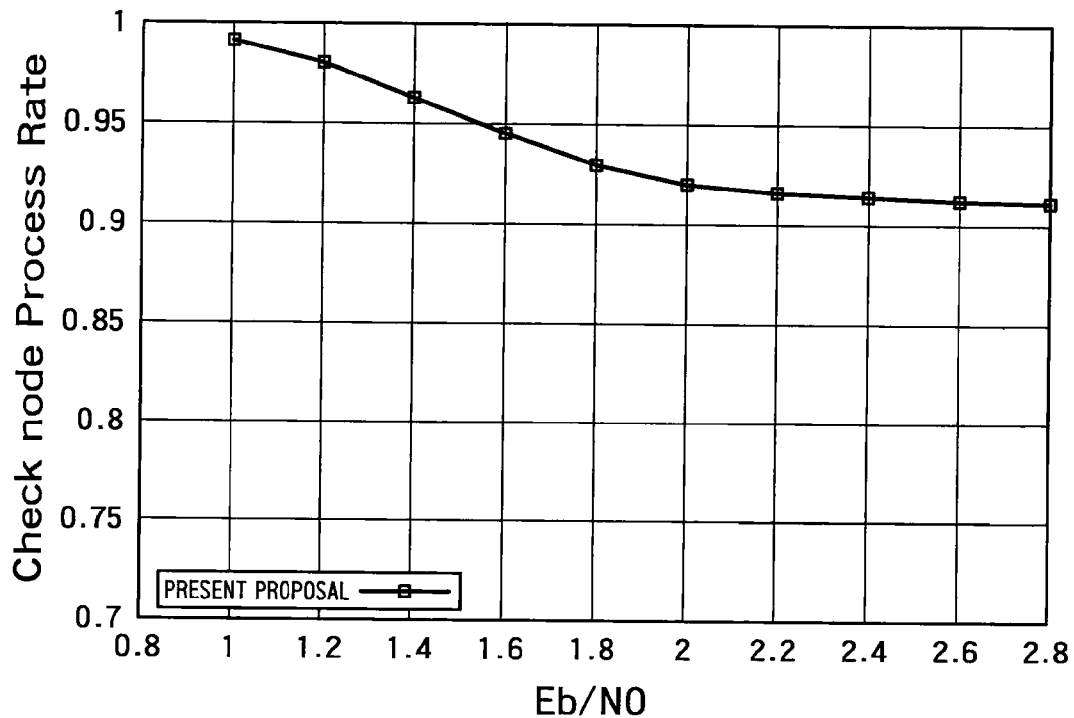
FIG. 4 is a graph showing an operation amount ratio of row processing between the first embodiment of the present invention and a conventional scheme.

FIG. 4 is a graph showing the ratio of the amount of row operation on a Gaussian thermal noise communication channel between the decoding apparatus of this embodiment and the conventional decoding apparatus. This graph has been obtained based on the result of an independent numerical experiment by the present inventors. Furthermore, FIG. 5 is a graph showing the respective bit error rate (BER) characteristics of the decoding apparatus of the first embodiment and the conventional decoding apparatus.

A check matrix of a regular LDPC code having a code length of 1004 bits, parity length of 502 bits and coding rate of 0.5 is used as the check matrix of an LDPC code, and the maximum number of iterations is assumed to be 20 and the modulation scheme is assumed to be BPSK.

In FIG. 4, the horizontal axis shows Eb/NO (ratio of energy per bit to noise power) and the vertical axis shows an amount of row operation of the present invention assuming that the amount of row operation of the conventional scheme is 1. It is understandable from FIG. 4 that according to this embodiment, the amount of row operation has been reduced by a little less than 10% compared to the conventional scheme.

Figure 5:
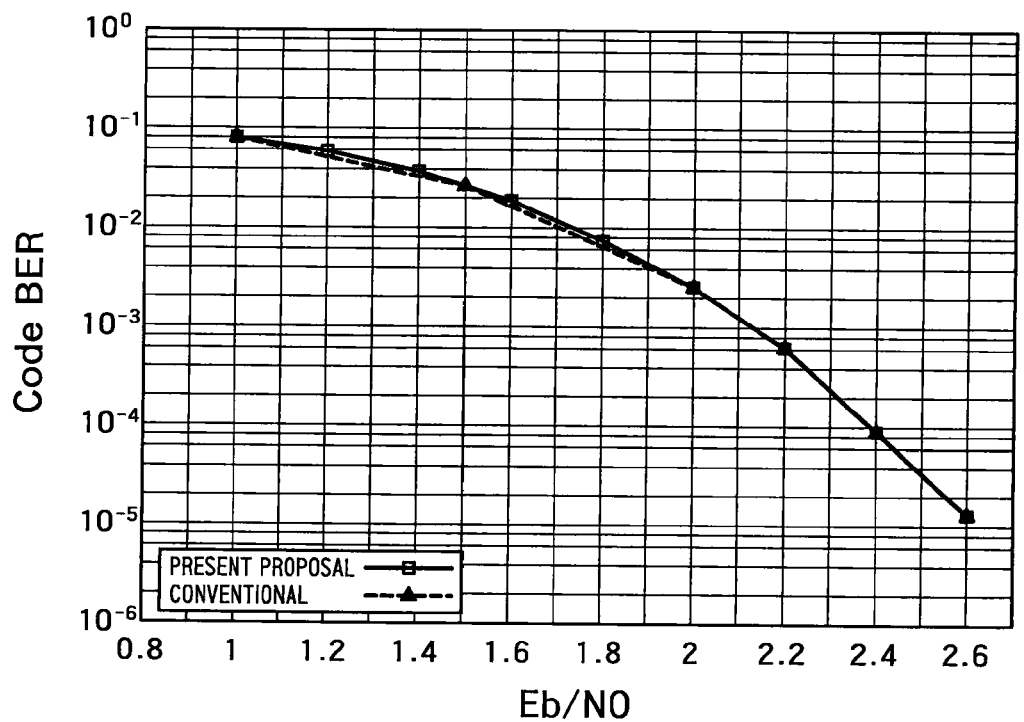
FIG. 5 is a graph showing a bit error rate characteristic between the first embodiment of the present invention and the conventional scheme.

Furthermore, it can be confirmed from FIG. 5 that the bit error rate characteristic of this embodiment is substantially the same as that of the conventional scheme.

It is apparent from the explanations so far that this embodiment can reduce the amount of row operation by a little less than 10% without substantially degrading the bit error rate characteristic.

As described above, when the syndrome value (reliability coefficient) obtained through row processing of min-sum decoding satisfies a threshold, this embodiment performs control so as to set the row processing flag to "false" and execute row processing only on rows whose row processing flag is "true." This causes only minimum necessary row processing to be executed, and can thereby reduce the amount of operation of the entire decoding and improve the decoding throughput.

Next, a second embodiment of the present invention will be explained.

Figure 6:
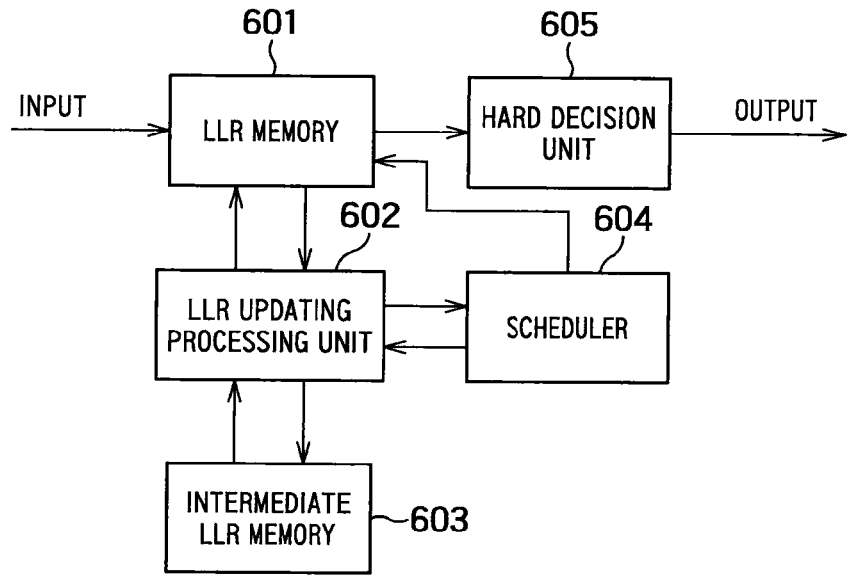
FIG. 6 is a block diagram showing the configuration of a decoding apparatus according to a second embodiment.

FIG. 6 is a block diagram showing the configuration of a decoding apparatus according to a second embodiment of the present invention.

As opposed to the decoding apparatus of the first embodiment which adopts "Flooding Schedule" whereby row processing and column processing are executed collectively, the decoding apparatus of the second embodiment is characterized by adopting "Sequential Schedule" whereby row processing and column processing are successively executed from one row index to another. This decoding apparatus may further be provided with the configuration of a coding apparatus.

The decoding apparatus in FIG. 6 is provided with an LLR memory (reception unit, data storage) 601, an LLR updating processing unit (second operation unit, first operation unit, calculation unit, data storage updating unit, first storage) 602, an intermediate memory (second storage) 603, a scheduler (controller, flag storage, flag initialization unit) 604, and a hard decision unit 605.

The LLR memory 601 stores received word data (input LLR) inputted from a signal processing unit (not shown) in the preceding stage and stores this until decoding is completed as an output LLR. As in the case of the first embodiment, the received word data is made up of input LLRs corresponding to respective bits of a codeword. Under an instruction from the scheduler 604, the LLR memory 601 inputs/outputs the stored output LLRs to/from the LLR updating processing unit 602 and the LLR updating processing unit 602 updates the output LLRs. Upon completion of LLR updating processing, the LLR memory 601 outputs all updated received word data (updated output LLRs) to the hard decision unit 605.

Following an execution instruction from the scheduler 604, the LLR updating processing unit 602 executes row processing (syndrome value (reliability coefficient) operation, row operation) and column processing (column operation, updating processing) for each specified row index using the output LLRs inputted from the LLR memory 601 and row element LLRs (row operation data) inputted from the intermediate memory 603. The LLR updating processing unit 602 outputs the syndrome value (reliability coefficient) to the scheduler 602 and writes the row element LLRs (row operation data) into the intermediate memory 603 and writes the output LLRs into the LLR memory 601. The LLR updating processing unit 602 stores the column operation data in the own unit. That is, upon receiving a write request the LLR updating processing unit 602 may also include a first storage which stores column operation data for the corresponding element (row number and column number). This first storage may also be provided for the intermediate memory 603.

Hereinafter, row processing (syndrome value (reliability coefficient) operation, row operation) and column processing (column operation, updating operation) carried out on the row index m will be explained using formulas.

First, column element LLR (column operation data) will be calculated by carrying out a column operation using an output LLR $q_n$ and row element LLR (row operation data) $r_{mn}^{i-1}$ according to the following formula.

$$q_{mn} = q_n - r_{mn}^{(i-1)}$$ [Formula 9]

At the start of decoding (i=1), $q_{mn} = q_n = F_n$. "$F_n$" is an LLR (received word data) inputted from a signal processing unit (not shown) in the preceding stage to the decoding apparatus. Next, row processing (syndrome value (reliability coefficient) operation and row operation) are executed and a syndrome value (reliability coefficient) $s_m^{(i)}$ and row element LLR (row operation data) $r_{mn}$ are obtained from following Formula 10 and Formula 11.

$$r_{mn}^{(i)} = \prod_{n' \in N(m) \setminus n} \text{sign}(q_{mn'}) \times \min_{n' \in N(m) \setminus n} (|q_{mn'}|)$$ [Formula 10]

$$s_m^{(i)} = \prod_{n \in N(m)} \text{sign}(q_{mn}) \times \min_{n \in N(m)} (|q_{mn}|)$$ [Formula 11]

"n" represents a column index and "i" represents the number of iterations of decoding.

"N(m)" represents a set of column indexes having values of "1" in the parity check equation of the row index m.

"N(m)\n" represents a partial set of column indexes resulting from excluding n from the set N(m).

"sign (x)" and "min (x)" are the functions explained in the first embodiment of the present invention.

Here, as in the case of the first embodiment, row element LLRs (row operation processing data) $r_{mn}^{(i)}$ may be calculated using Formula 4 using the syndrome value $s_m^{(i)}$ instead of Formula 10 or further using a modified-min-sum algorithm such as Formula 5 and Formula 6.

After calculating the row element LLR (row operation data) $r_{mn}^{(i)}$ of each column index according to Formula 10, the output LLR $q_n$ is updated through the updating operation shown in Formula 12 below. In the decoding processing in the second and subsequent iterations, the value of $q_n$ updated through the immediately preceding decoding processing will be continued to be used.

$$q_n = q_{mn} + r_{mn}^{(i)}$$ [Formula 12]

In this way, the LLR updating processing unit 602 is characterized by updating the output LLR for each parity check equation by performing row processing and column processing for each row.

As is understandable from the explanation of the LLR updating processing unit 602, the intermediate memory 603 stores the row element LLR (row operation data) $r_{mn}^{(i)}$ calculated by the LLR updating processing unit 602 upon receiving a write request from the LLR updating processing unit 602. The intermediate memory 603 stores the row element LLR requested to be written (row operation data) $r_{mn}^{(i)}$ while decoding processing is being executed.

The scheduler 604 performs control over the entire decoding processing.

More specifically, the scheduler 604 instructs the LLR updating processing unit 602 to execute the LLR updating processing (row processing and column processing).

Furthermore, the scheduler 604 judges whether or not to finish decoding processing based on the syndrome value (reliability coefficient) inputted from the LLR updating processing unit 602 and a maximum number of iterations given beforehand.

Furthermore, when deciding to end the decoding processing, the scheduler 604 instructs the LLR memory 601 to output the updated received word data, that is, updated output LLR to the hard decision unit 605.

Figure 7:
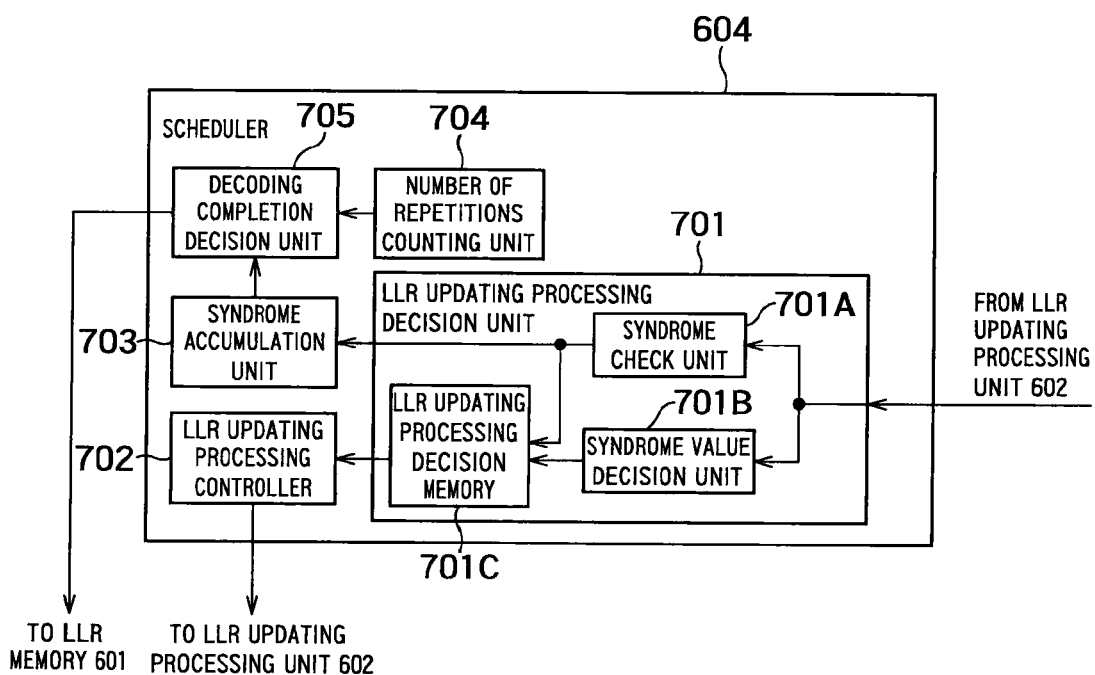
FIG. 7 is a block diagram of the scheduler in FIG. 6.

FIG. 7 is a detailed block diagram of the scheduler 604.

The scheduler 604 is provided with an LLR updating processing decision unit 701, an LLR updating processing controller 702, a syndrome accumulation unit 703, a number of iterations counting unit 704 and a decoding completion decision unit (termination unit) 705.

The LLR updating processing decision unit 701 is provided with a syndrome check unit 701A, a syndrome value decision unit 701B, and an LLR updating processing decision memory 701C.

The LLP updating processing decision unit 701 separates the syndrome value (reliability coefficient) inputted from the LLR updating processing unit 602 for each row into a sign and absolute value and inputs information on the sign to the syndrome check unit 701A and information on the absolute value to the syndrome value decision unit 701B respectively.

The syndrome check unit 701A checks whether the sign of the syndrome value (reliability coefficient) is positive or negative, and outputs "true" when positive and "false" when negative to the row processing decision memory 701C and syndrome accumulation unit 703.

The syndrome value decision unit 701B decides whether or not the inputted absolute value is greater than a predefined threshold, and outputs "true" when it is greater than the threshold and "false" when it is smaller than the threshold to the LLR updating processing decision memory 701C. Suppose the threshold is determined beforehand through a numerical experiment such as a computer simulation. Furthermore, a value varying from one row index to another may be set as the threshold.

The LLR updating processing decision memory 701C stores an LLR updating processing flag for each row index of the check matrix. The initial value of the LLR updating processing flag is set to, for example, "true" (second value). When the inputs from both the syndrome check unit 701A and syndrome value decision unit 701B are "true," the LLR updating processing decision memory 701C sets the LLR updating processing flag of the row index corresponding to the syndrome value inputted from the LLR updating processing unit 602 to "false" (first value). The row index means the row index of the parity check matrix of an LDPC code as in the case of the first embodiment.

The LLR updating processing controller 702 selects the row index on which the next LLR updating processing should be performed based on the LLR updating processing decision memory 701C, specifies the selected row index and thereby instructs the LLR updating processing unit 602 to execute the LLR updating processing. In this case, the row index is selected so that the LLR updating processing on the row index whose LLR updating processing flag is "false" is skipped. The row index is selected, for example, in ascending order of row index numbers. In this way, by controlling the LLR updating processing unit 602 so as to execute only the necessary minimum LLR updating processing, it is possible to reduce the amount of operation necessary for the entire decoding processing and improve the decoding throughput.

The syndrome accumulation unit 703 accumulates (ANDs) syndrome check results ("true" ("1") or "false" ("0")) inputted from the syndrome check unit 701A for each row index for all rows and thereby obtains a syndrome accumulated value. The syndrome accumulated value becomes "true" only when the syndrome check results become "true" for all rows and the syndrome accumulated value becomes "false" when there is even one row on which the syndrome check result becomes "false." The syndrome accumulation unit 703 outputs the syndrome accumulated value to the decoding completion decision unit 705.

The iteration number counting unit 704 counts the number of iterations of decoding processing and outputs the number of iterations to the decoding completion decision unit 705.

When the syndrome accumulated value inputted from the syndrome accumulation unit 703 becomes "true" or when the number of iterations inputted from the iteration number counting unit 704 reaches a preset maximum number of iterations, the decoding completion decision unit 705 decides that the decoding processing has been completed. When the decoding completion decision unit 705 decides that the decoding processing has been completed, it instructs the LLR memory 601 to output the updated output LLR (updated received word data) to the hard decision unit 605.

The hard decision unit 605 decides whether the output LLR inputted from the LLR memory 601 is positive or negative and selects "0" when it is positive and "1" when it is negative. The hard decision data decided for each bit which is "0" or "1" is outputted to a signal processing unit (not shown) in the subsequent stage.

Next, the operation of the decoding apparatus configured as shown above will be explained.

Figure 8:
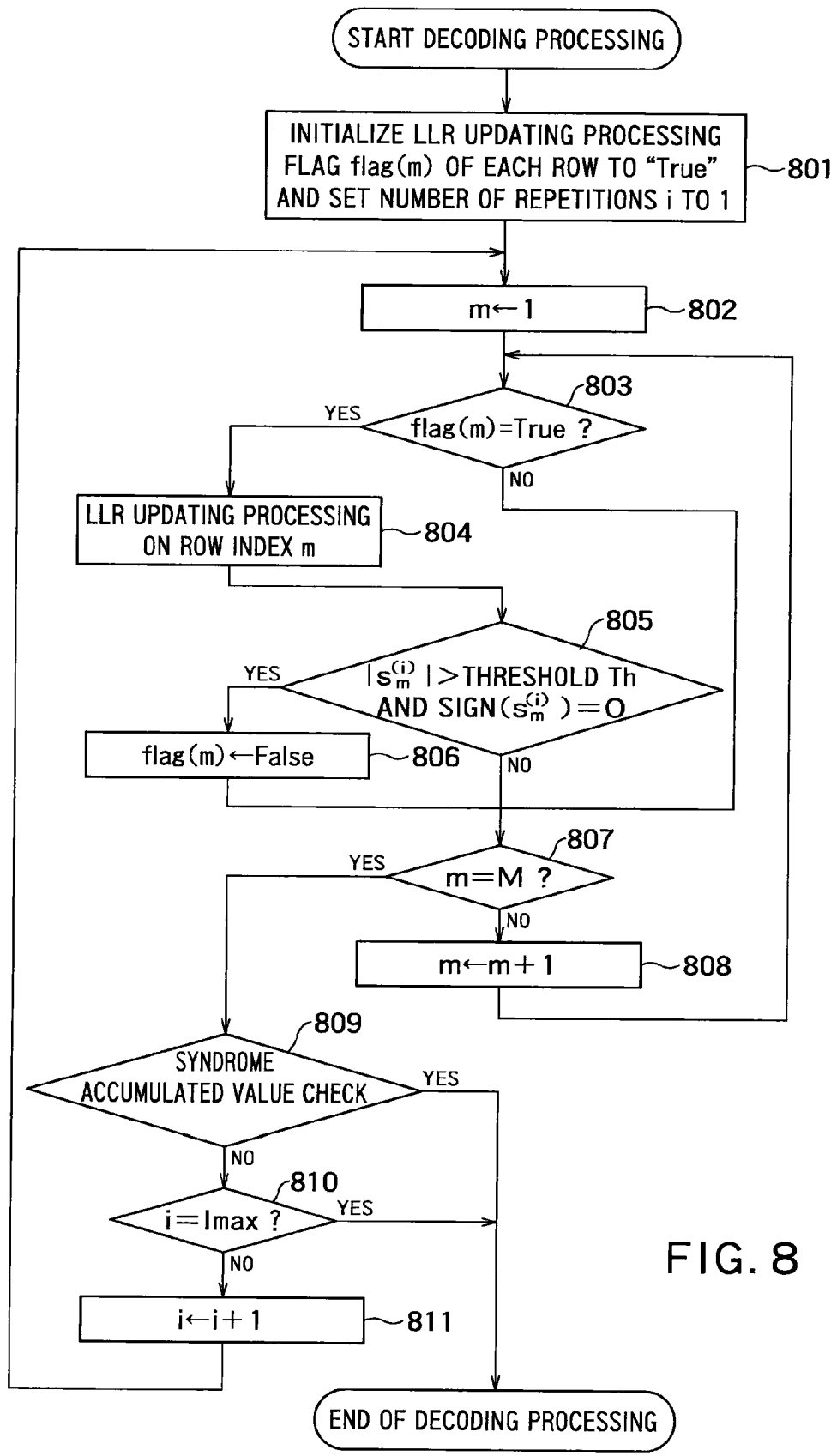
FIG. 8 is a flowchart illustrating a decoding method according to the second embodiment.

FIG. 8 is a flowchart showing a flow of operation of the decoding apparatus in FIG. 6. In FIG. 8, "m" represents a row index, "M" represents the number of rows of the parity check matrix, "i" represents the number of iterations and "Imax" represents the maximum number of iterations.

When the received word data (input LLR) is inputted from a signal processing unit (not shown) in the preceding stage to the decoding apparatus and all the received word data is inputted, decoding processing is started. The inputted received word data (input LLR) is stored in the LLR memory 601 as the output LLR during decoding processing and updated through decoding processing.

First, initial processing is performed in step 801. More specifically, all the LLR updating processing flags of the LLR updating processing decision memory 701C are set to "true" and the number of iterations i is set to "1."

Next, the row index m on which LLR updating processing is executed is set to "1" in step 802.

Next, it is judged in step 803 whether or not the LLR updating processing flag of the row index m is "true" and when the LLR updating processing flag is not "true," the LLR updating processing is skipped and the process moves to step 807. When the LLR updating processing flag is "true," LLR updating processing is executed on the row index m in step 804 and it is decided in next step 805 whether or not the absolute value of the syndrome value (reliability coefficient) is greater than a predetermined threshold and the sign of the syndrome value (reliability coefficient) is "0."

When the decision in step 805 is "NO," the process moves to step 807. On the other hand, when the decision in step 805 is "YES," the process moves to step 806 and the LLR updating processing flag of the row index m is set to "false."

It is decided in step 807 whether or not the row index m is the final row index M and when the decision is "NO," the row index m is incremented in step 808 and the process returns to step 803.

When the decision in step 807 is "YES," the process moves to step 809, where the syndrome accumulated value is decided. When the syndrome accumulated value is "true," a hard decision is made and then decoding processing is finished, whereas when the syndrome accumulated value is "false," the process moves to step 810.

It is decided in step 810 whether or not the iteration number "i" has reached the maximum number of iterations "Imax." When the iteration number "i" has reached "Imax," for example, a hard decision is made and then the decoding processing is finished, whereas when the iteration number "i" has not reached "Imax," the iteration number "i" is incremented in step 811 and then the process returns to step 802.

As described above, according to this embodiment, when the syndrome value (reliability coefficient) obtained through LLR updating processing of min-sum decoding satisfies a threshold, the LLR updating processing flag is set to "false" and control is performed so as to execute LLR updating processing only on rows where the LLR updating processing flag is "true." This allows only the minimum necessary LLR updating processing to be executed, and can thereby reduce the amount of operation of whole decoding and improve the decoding throughput.

Figure 9:
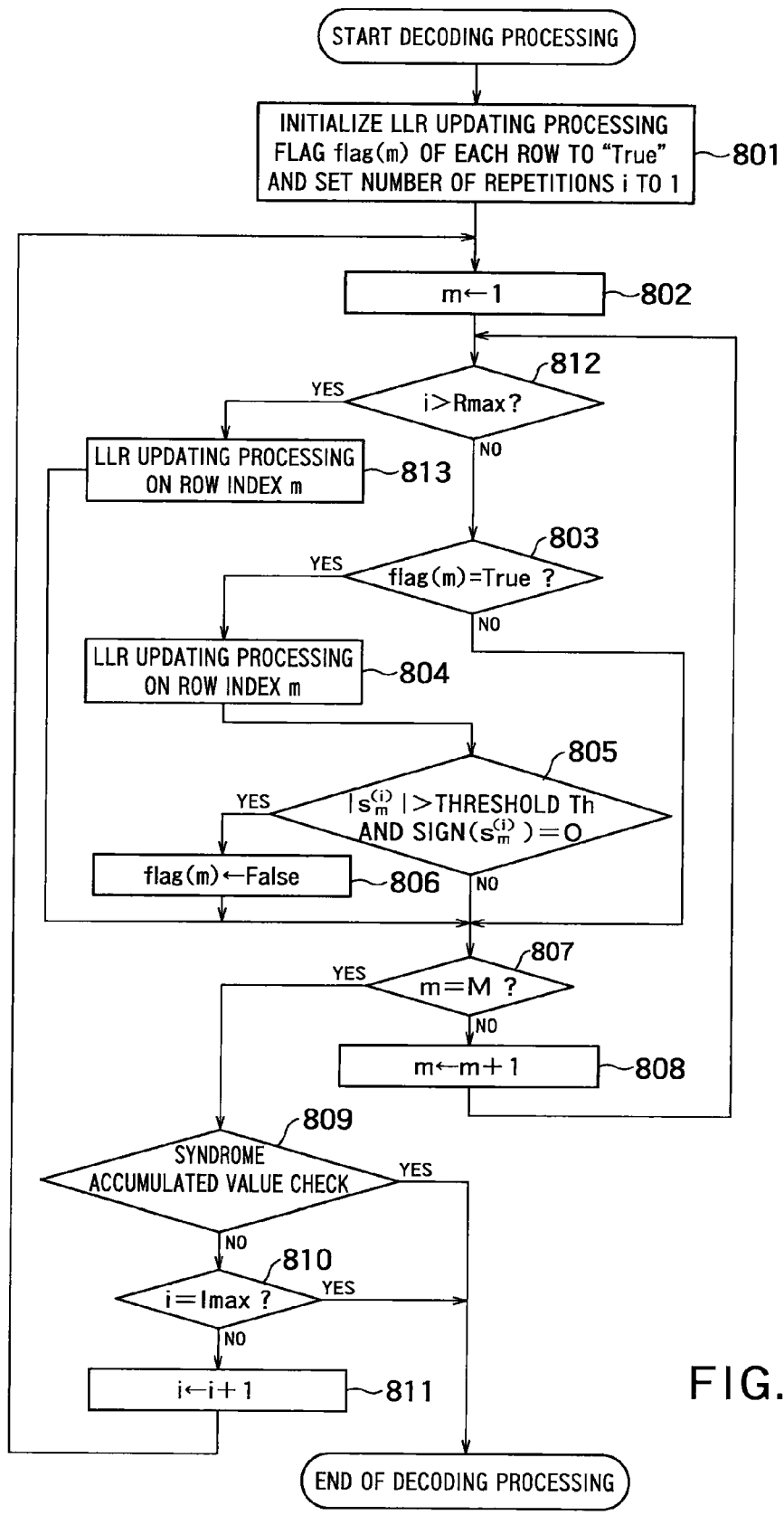
FIG. 9 is a flowchart illustrating an other decoding method according to the second embodiment.

FIG. 9 is a flowchart of other operation performed by the decoding apparatus in FIG. 6. Steps 812 and 813 are added subsequently to step 802 in the flowchart of FIG. 8. Incidentally, the same steps as the steps 812 and 813 can be added subsequently to step 302 in the flowchart of FIG. 3, as well.

In FIG. 9, after steps 801 and 802 are performed, it is determined whether or not the iteration number "i" has grown more than a threshold "Rmax". The threshold "Rmax" is a positive value less than the threshold "Imax".

When the iteration number "i" has grown more than the threshold "Rmax", the LLR updating processing is performed for row index m and the flow proceeds to step 807. On the other hand, when the iteration number "i" is the "Rmax" or less, the flow proceeds to step 803. The subsequent steps are same as those of FIG. 8.

In processing shown in FIG. 8, as the predetermined threshold (see step 805) is lowered, the computation effort is reduced. However, in this case, there are many cases that the iteration decoding is not converged (i.e. step 809 is not proceed to YES) and consequently, the decoding performance lowers. For this reason, it is difficult to set the predetermined threshold to a small value in the embodiment relevant to FIG. 8. On the contrary, in the embodiment relevant to FIG. 9, when the iteration decoding is not converged (i.e. the iteration number "i" become more than the "Rmax"), the updating processing is resumed according to the steps 812 and 813. The decoding performance deterioration is, therefore, prevented and accordingly, it is possible to set the predetermined threshold to a small value. As a result, the embodiment relevant to FIG. 9 allows an average computation amount to be lowered compared with that of the embodiment (see FIGS. 3 and 8) described heretofore.

The present invention is applicable to any system that uses an LDPC code. The present invention can be used for various storage systems such as a communication system, broadcasting system, magnetic recording system, optical disk system or furthermore semiconductor memory.

What is claimed is:

1. A decoding apparatus for decoding a low-density parity check code defined by a parity check matrix, comprising:
   a reception unit configured to receive word data;
   a first storage configured to store the received word data for each element of the parity check matrix as initialized column operation data, each element being defined by a row number and a column number, respectively;
   a second storage configured to receive row operation data and a write request of the row operation data and store the row operation data for an element according to the write request;
   a first operation unit configured to read column operation data in the first storage for elements of "1" for each row of the parity check matrix, carry out a row operation to thereby calculate row operation data for each of the elements of "1" for said each row and request writing of calculated row operation data to the second storage by specifying each of the elements of "1";
   a calculation unit configured to read column operation data in the first storage for elements of "1" for each row of the parity check matrix and calculate a reliability coefficient with respect to establishment of a parity check equation defined by said each row, respectively;
   a second operation unit configured to read row operation data in the second storage for elements of "1" for each column of the parity check matrix, carry out a column operation to thereby calculate column operation data for each of the elements of "1" for said each column and write calculated column operation data into the first storage for each of the elements of "1"; and
   a controller configured to iteratively execute one set which includes respective processing by the first operation unit, the calculation unit and the second operation unit and omit the processing by the first operation unit and the calculation unit in the one set for a row for which the reliability coefficient has satisfied a threshold.

2. The apparatus according to claim 1, further comprising:
   a data generation unit configured to read, when the one set has been iterated one or more times, the row operation data in the second storage for elements of "1" of the parity check matrix, correct the received word data based on read row operation data to generate corrected word data;
   a hard decision unit configured to make a hard decision on corrected word data to thereby acquire hard decision data; and
   a parity check unit configured to carry out a parity check on the hard decision data based on the parity check matrix and output decoded word data which is the hard decision data as when the result of the parity check is "true",
   wherein the controller continues to iteratively execute the one set when the result of the parity check is "false".

3. The apparatus according to claim 1, further comprising:
   a termination unit configured to terminate iterated execution by the controller when the reliability coefficient has satisfied the threshold for all rows in the parity check matrix or when the one set is executed a predetermined number of times iteratively;
   a data generation unit configured to read the row operation data in the second storage for elements of "1" of the parity check matrix and correct the received word data based on read row operation data to generate corrected word data;
   a hard decision unit configured to make a hard decision on the corrected word data to thereby acquire hard decision data; and
   an output unit configured to output decoded word data which is acquired hard decision data.

4. The apparatus according to claim 3, wherein
   the controller resumes the execution of the one set for an omitted row when an iteration number has grown more than an iteration threshold, the iteration threshold being lower than the predetermined number of times, and iteratively executes the one set for all rows until the reliability coefficient satisfies the threshold for all rows or the iteration number reaches the predetermined number of times.

5. The apparatus according to claim 1, further comprising:
   a flag storage configured to store a flag showing a first value or a second value for said each row of the parity check matrix, respectively; and
   a flag initialization unit configured to initialize the flag for said each row to the second value, respectively
   wherein the calculation unit changes the flag for said each row to the first value when the reliability coefficient for each row has satisfied the threshold, and
   the controller decides whether or not the reliability coefficient for said each row has satisfied the threshold by referring to the flag storage.

6. A decoding apparatus for decoding a low-density parity check code defined by a parity check matrix, comprising:
   a reception unit configured to receive word data;
   a data storage configured to store the received word data for each element of the parity check matrix, each element being defined by a row number and a column number, respectively;
   a second storage configured to store initialized row operation data for each element of the parity check matrix, each element being defined by a row number and a column number;

a first storage configured to receive column operation data and a write request of the column operation data and store the column operation data for an element according to the write request;

a second operation unit configured to read the received word data from the data storage for elements of "1" for each row of the parity check matrix, read row operation data from the second storage for elements of "1" for each row of the parity check matrix, carry out a column operation to thereby calculate column operation data for each the elements of "1" for said each row and request writing of calculated column operation data to the first storage by specifying each of the elements of "1";

a first operation unit configured to read column operation data from the first storage for elements of "1" for said each row, carry out a row operation to thereby calculate row operation data for each of the elements of "1" for said each row and write calculated row operation data into the second storage for each of the elements of "1";

a calculation unit configured to calculate a reliability coefficient with respect to establishment of a parity check equation defined by said each row, respectively using the column operation data read from the first storage for said each row;

a data updating unit configured to update the received word data in the data storage based on the column operation data calculated by the second operation unit and the row operation data calculated by the first operation unit for said each row; and a controller configured to iteratively execute one set which includes respective processing by the second operation unit, the first operation unit, the calculation unit and the data updating unit and omit execution of the one set for a row for which the reliability coefficient has satisfied a threshold.

7. The apparatus according to claim 6, further comprising:
a termination unit configured to terminate iterated execution by the controller when the reliability coefficient has satisfied the threshold for all rows of the parity check matrix or when the iteration is performed a predetermined number of times; and
a hard decision unit configured to read the received word data from the data storage, make a hard decision and output hard decision data as decoded word data.

8. The apparatus according to claim 7, wherein
the controller resumes the execution of the one set for an omitted row when an iteration number has grown more than an iteration threshold, the iteration threshold being lower than the predetermined number of times, and iteratively executes the one set for all rows until the reliability coefficient satisfies the threshold for all rows or the iteration number reaches the predetermined number of times.

9. The apparatus according to claim 6, further comprising:
a flag storage configured to store a flag indicating a first value or a second value for said each row of the parity check matrix, respectively; and
a flag initialization unit configured to initialize the flag for said each row, respectively
wherein the calculation unit changes the flag for said each row to the first value when the reliability coefficient for said each row has satisfied the threshold, and
the controller determines whether or not the reliability coefficient has satisfied the threshold by referring to the flag storage.

10. A decoding method for decoding a low-density parity check code defined by a parity check matrix, comprising:
receiving word data;
storing initialized column operation data which is the received word data in a first storage for each element of the parity check matrix, each element being defined by a row number and a column number, respectively;
reading column operation data in the first storage for elements of "1" for each row of the parity check matrix, carrying out a row operation to thereby calculate row operation data for each of the elements of "1" for said each row and writing calculated row operation data to a second storage for each of the elements of "1";
reading column operation data in the first storage for elements of "1" for said each row and calculating a reliability coefficient with respect to establishment of a parity check equation defined by said each row, respectively;
reading row operation data in the second storage for elements of "1" for said each column, carrying out a column operation to thereby calculate column operation data for each of the elements of "1" for said each row and writing calculated column operation data into the first storage for each of the elements of "1";
iteratively executing one set which includes the calculation and the writing of the row operation data, the calculation of the reliability coefficient, the calculation and the writing of the column operation data; and
omitting said calculation and writing of the row operation data and said calculation of the reliability coefficient in the one set for a row for which the reliability coefficient has satisfied a threshold.

11. The method according to claim 10, further comprising:
when the one set has been iterated one or more times, reading the row operation data in the second storage for elements of "1" of the parity check matrix and correcting the received word data based on read row operation data to generate corrected word data;
making a hard decision on corrected word data to thereby acquire hard decision data;
carrying out a parity check on the hard decision data based on the parity check matrix;
outputting decoded word data which is the hard decision data when the result of the parity check is "true,"
continuing to iteratively execute the one set when the result of the parity check is "false".

12. The apparatus according to claim 10, further comprising:
terminating iterated execution when the reliability coefficient has satisfied the threshold for all rows in the parity check matrix or when the one set is executed a predetermined number of times iteratively;
reading the row operation data stored in the second storage for elements of "1" of the parity check matrix and correcting the received word data based on read row operation data to generate corrected word data;
making a hard decision on the corrected word data to thereby acquire hard decision data; and
outputting decoded word data which is acquired hard decision data.

13. The method according to claim 12, further comprising:
resuming the execution of the one set for an omitted row when an iteration number has grown more than an iteration threshold, the iteration threshold being lower than the predetermined number of times, and
iteratively executing the one set for all rows until the reliability coefficient satisfies the threshold for all rows or the iteration number reaches the predetermined number of times.

14. A decoding method for decoding a low-density parity check code defined by a parity check matrix, comprising:
- receiving word data and writing the received word data into a data storage for each element of the parity check matrix, each element being defined by a row number and a column number, respectively;
- reading the received word data from the data storage for elements of "1" for each row of the parity check matrix, reading row operation data for elements of "1" for each row of the parity check matrix from a second storage which stores initialized row operation data in advice for each element of the parity check matrix, each element being defined by a row number and a column number, carrying out a column operation to thereby calculate column operation data for each of the elements of "1" for said each row and writing calculated column operation data to the first storage for each of the elements of "1";
- reading column operation data from the first storage for elements of "1" for said each row, carrying out a row operation to thereby calculate row operation data for each of the elements of "1" for said each row and writing calculated row operation data into the second storage for each of the elements of "1";
- calculating a reliability coefficient with respect to establishment of a parity check equation defined by said each row, respectively, using the column operation data read from the first storage for said each row;
- updating the received word data in the data storage based on the calculated column operation data and the calculated row operation data for said each row;
- iteratively executing one set which includes the calculation and the writing of the column operation data, the calculation and the writing of the row operation data, the calculating of the reliability coefficient and the updating of the received word data; and
- omitting execution of the one set for a row for which the reliability coefficient has satisfied a threshold.

15. The method according to claim 14, further comprising:
- terminating iterated execution when the reliability coefficient has satisfied the threshold for all rows of the parity check matrix or when the iteration is performed a predetermined number of times; and
- reading the received word data from the data storage, making a hard decision and outputting hard decision data as decoded word data.

16. The method according to claim 15, further comprising:
- resuming the execution of the one set for an omitted row when an iteration number has grown more than an iteration threshold, the iteration threshold being lower than the predetermined number of times, and
- iteratively executing the one set for all rows until the reliability coefficient satisfies the threshold for all rows or the iteration number reaches the predetermined number of times.

* * * * *